US011476198B2

(12) United States Patent
Cheah et al.

(10) Patent No.: US 11,476,198 B2
(45) Date of Patent: Oct. 18, 2022

(54) MULTI-LEVEL COMPONENTS FOR INTEGRATED-CIRCUIT PACKAGES

(71) Applicant: Intel Corporation, Santa Clara, CA (US)

(72) Inventors: Bok Eng Cheah, Bukit Gambir (MY); Jackson Chung Peng Kong, Tanjung Tokong (MY); Jenny Shio Yin Ong, Bayan Lepas (MY); Seok Ling Lim, Kulim (MY); Kok Keng Wan, Butterworth (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/024,182

(22) Filed: Sep. 17, 2020

(65) Prior Publication Data

US 2021/0183779 A1 Jun. 17, 2021

(30) Foreign Application Priority Data

Dec. 11, 2019 (MY) .......................... PI 2019007402

(51) Int. Cl.
*H01L 23/538* (2006.01)
*H01L 23/00* (2006.01)
*H01L 21/50* (2006.01)
*H01L 21/60* (2006.01)

(52) U.S. Cl.
CPC .......... *H01L 23/5386* (2013.01); *H01L 21/50* (2013.01); *H01L 23/5384* (2013.01); *H01L 23/5385* (2013.01); *H01L 24/14* (2013.01); *H01L 2021/60022* (2013.01)

(58) Field of Classification Search
CPC . H01L 23/5386; H01L 23/5384; H01L 21/50; H01L 24/14; H01L 2021/60022
USPC ........................................................ 257/737
See application file for complete search history.

(56) References Cited

U.S. PATENT DOCUMENTS

2018/0053745 A1\* 2/2018 Cheng ..................... H01L 24/20
2019/0371734 A1\* 12/2019 Chang ..................... H01L 24/17

\* cited by examiner

*Primary Examiner* — Quoc D Hoang
(74) *Attorney, Agent, or Firm* — Schwegman Lundberg & Woessner, P.A.

(57) ABSTRACT

Disclosed embodiments include multi-level fan-out integrated-circuit package substrates that provide a low-loss path to active and passive devices, by shunting away from interconnects and inductive loops. The multi-level form factor of a molded mass, allows for the low-loss path.

20 Claims, 9 Drawing Sheets

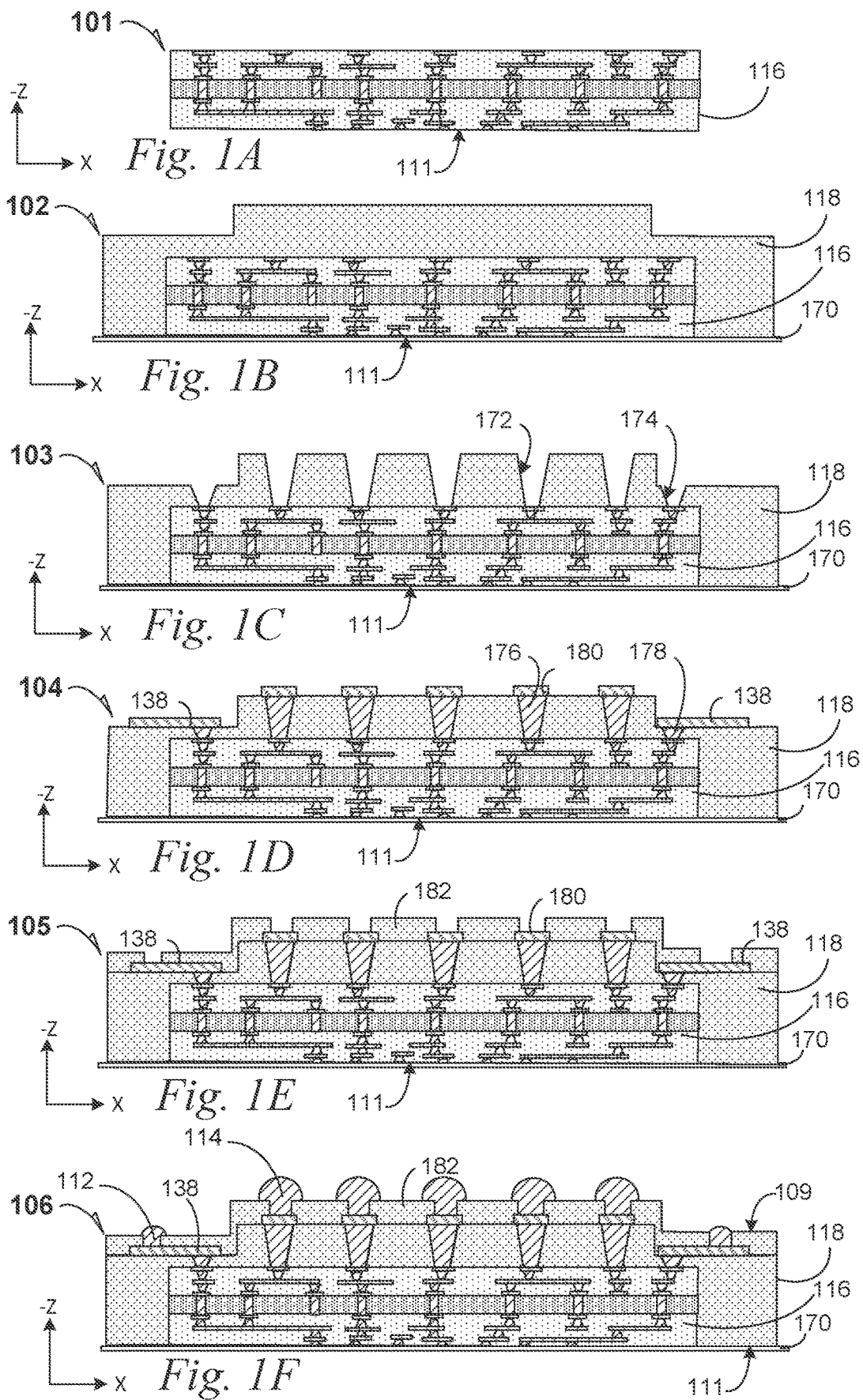

US 11,476,198 B2

MULTI-LEVEL COMPONENTS FOR INTEGRATED-CIRCUIT PACKAGES

PRIORITY APPLICATION

This application claims the benefit of priority to Malaysian Application Serial Number PI2019007402, filed Dec. 11, 2019, which is incorporated herein by reference in its entirety.

FIELD

This disclosure relates to low-loss interconnections for integrated-circuit device packages.

BACKGROUND

Signal and power integrity is challenging for complex packaging of integrated-circuit components coupled to packages and boards. Challenges include such issues as insertion loss, return loss, inductance loops and impedance peak profiles that hinder utility.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of the integrated-circuit package substrate depicted in FIGS. 1 and 1T during assembly according to several embodiments;

FIG. 1B is a cross-section elevation of the integrated-circuit package substrate depicted in FIG. 1A after further assembly according to an embodiment;

FIG. 1C is a cross-section elevation of the integrated-circuit package substrate depicted in FIG. 1B after further assembly according to an embodiment;

FIG. 1D is a cross-section elevation of the integrated-circuit package substrate depicted in FIG. 1C after further assembly according to an embodiment;

FIG. 1E is a cross-section elevation of the integrated-circuit package substrate depicted in FIG. 1D after further assembly according to an embodiment;

FIG. 1F is a cross-section elevation of the integrated-circuit package substrate depicted in FIG. 1E after further assembly according to an embodiment;

DETAILED DESCRIPTION

Disclosed embodiments include multi-level fan-out interconnects for integrated-circuit (IC) package substrates, that simplify signal and current-loop paths to passive devices that are proximate an integrated-circuit (IC) die on the die side of the IC package substrates. Vertical interconnects are reduced in interconnect paths, to passive and active devices on the IC package boards that support IC package substrates.

Figure 1:
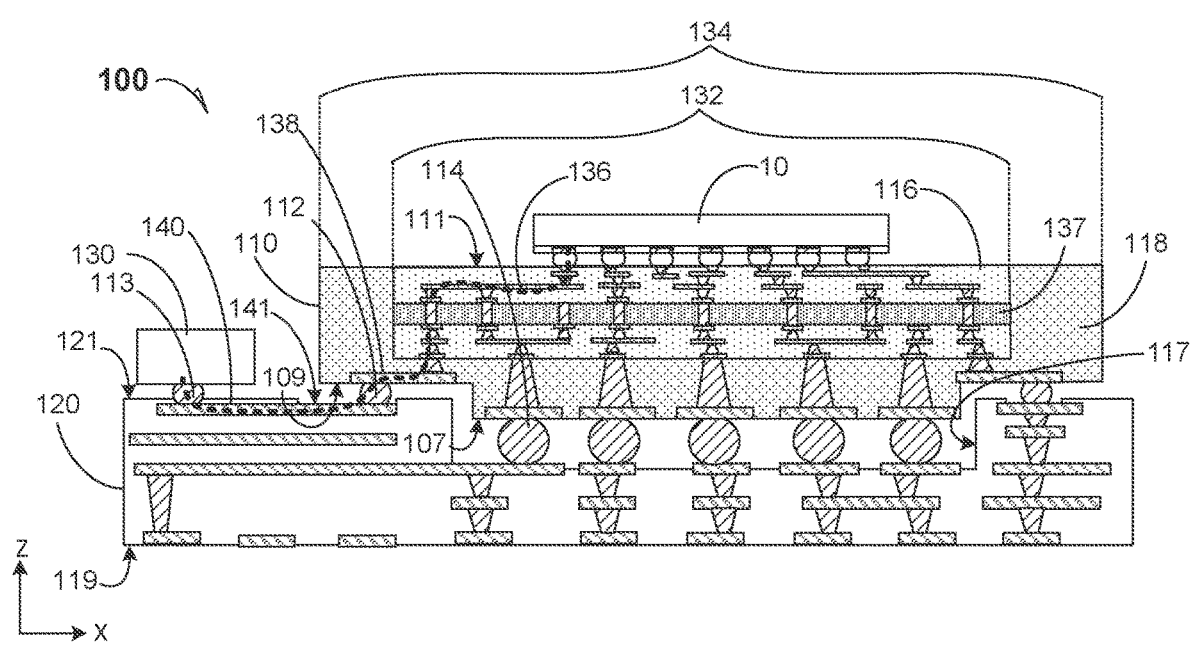
FIG. 1 is a cross-section elevation of an integrated-circuit package with a multi-level fan-out integrated-circuit package substrate according to several embodiments.

FIG. 1 is a cross-section elevation of an integrated-circuit package 100 with a multi-level fan-out integrated-circuit package substrate 110 according to several embodiments. A die side surface 111 supports a first integrated-circuit (IC) die 10, a first land side 109 contacts a micro bump 112 (also referred to as a bump 112), and a subsequent land side 107 contacts a recess electrical bump 114 according to several embodiments. The "micro bump" may be distinguished from larger bumps, e.g. item 114 with diameter ranging between 250 micrometer (μm) and 500 μm, and where the micro bump 112 has a diameter, which may be less than 200 μm. Further, the "micro bump" may be distinguished from other electrical bumps, where the "micro bump 112" is equal to or smaller than the bump on the subsequent land side 107. Further in an embodiment, the micro bump 112 is meant to be located by difference, at the first land side 109 and not at the subsequent land side 107.

In an embodiment, the IC package substrate 110 is a composite of an IC build-up layer 116 and a molding mass substrate 118 (hereinafter "molding mass 118") that at least partially encapsulates the IC substrate build-up layer 116. The die side surface 111 (hereinafter "die side 111") of the IC package substrate 110 shares both a portion of the IC substrate build-up layer 116 and the molding mass 118. In an embodiment, both the first land side 109 and the subsequent land side 107 include surfaces of the molding mass 118.

Each occurrence of the micro bump 112 and of the recess electrical bump 114 also contact a board 120 e.g., a printed circuit board 120, a printed wiring board 120 or a motherboard 120. The subsequent land side 107 of the IC package substrate 110, extends toward and in some embodiments, into a recess 117 of the board 120.

In an embodiment, the IC substrate build-up layer 116 has package bond pads, package vias and package traces that provide communication between the die side 111 and the first and subsequent land sides 109 and 107. Similarly, the board 120 has bond pads, vias and board traces that provide communication between the die side 121 and the land side 119. Communication between the IC substrate build-up layer 116 and the board 120 is accomplished through the micro-bumps 112 and the larger recess electrical bumps 114.

In an embodiment, the IC substrate build-up layer 116 has a core layer 137 to enhance mechanical warpage control. In an embodiment, the IC substrate build-up layer 116 is a coreless substrate build-up layer for z-height reduction or improved signal integrity for high-speed data bus applications.

In an embodiment, a passive device 130 is on the die side 121 of the board 120. An IC substrate build-up layer footprint 132 and a molding-mass footprint 134 help to define lateral dimensions of the IC package substrate 110.

Communication between the first IC die 10 and the passive device 130 is by an interconnect path 136 that minimizes interconnection through the board 120. The interconnect path 136 is illustrated with a heavy dashed line 136. The interconnect path 136 passes from the IC die 10, into the IC substrate build-up layer 116, and through several vias, bond pads and traces within the IC substrate build-up layer 116. The interconnect path 136 further passes through a conductive segment 138 that is on the first land side 109 and at least partially embedded within the molding mass 118 of the IC package substrate 110.

The interconnect path 136 further continues in a printed wiring board contact trace 140, such that it is a single-segment conductive body 140 for the entirety of the interconnect path 136 within the board 120. In an embodiment, the wiring board contact trace 140 includes an exposed bond finger 141 that allows the micro bump 112 to couple the conductive segment 138 in the molding mass 118 and the wiring board contact trace 140 by direct contact.

Finally, the interconnect path 136 reaches the passive device 130 by contacting a subsequent micro bump 113 (also referred to as a bump 113). By accomplishing the interconnect path 136, as described, substantial reduction of inductive looping is experienced, as the undesired interconnection through extensive path or transitions within the board 120 is avoided. Consequently, no interconnect path between the IC die 10 and the passive device 130, must pass out of the subsequent land side 107 and into the lower echelons of the board 120, before being required to loop back upwardly (positive-Z direction) toward the passive device 130. In any event, the interconnect path 136 is restricted to vertically away from the die side 111, and single-direction laterally to the conductive segment 138 on the first land side 109.

Figure 1G:
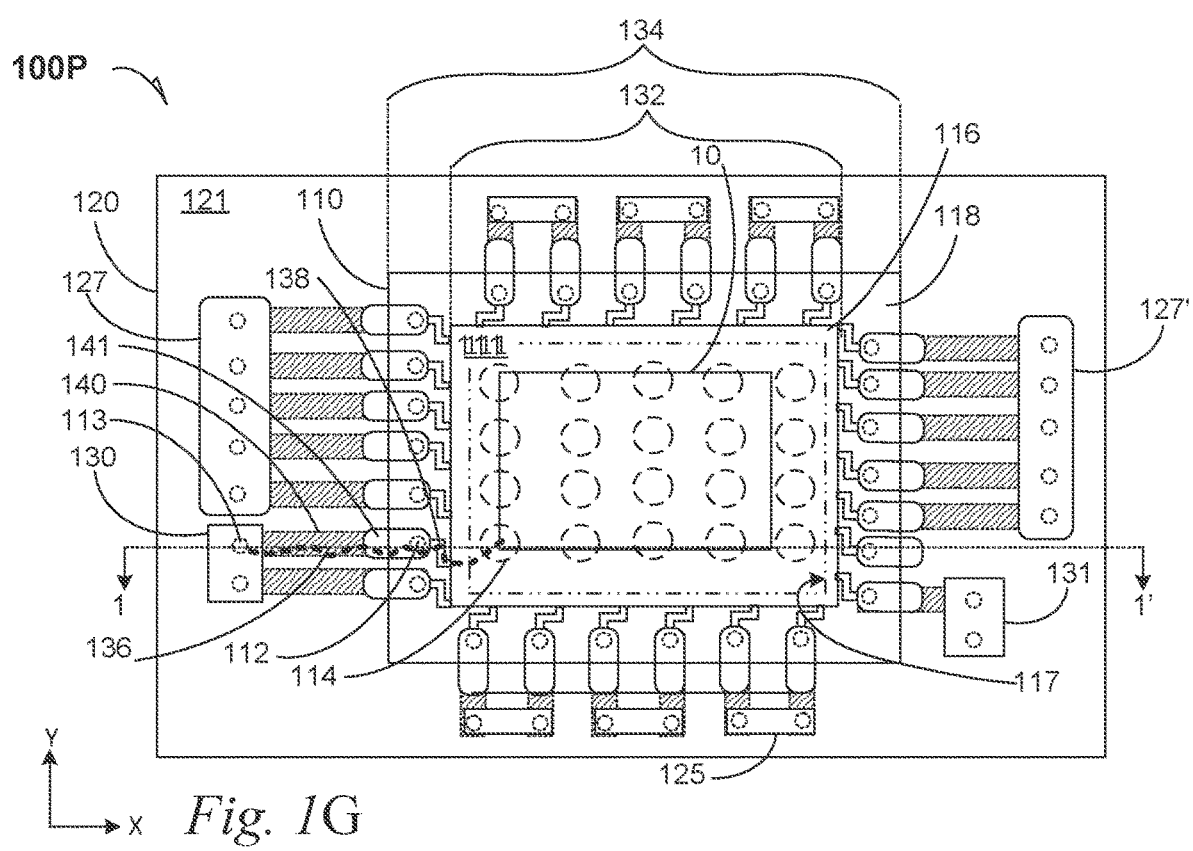
FIG. 1G is a top plan with cut-away and outline designations of the integrated-circuit package depicted in FIG. 1 according to several embodiments.

FIG. 1G is a top plan 100P, with cut-away and outline designations of portions of the integrated-circuit package 110 depicted in FIG. 1 according several embodiments. A cross-section view of FIG. 1 is taken along the line 1-1'.

The die side 111 of the IC substrate build-up layer 116, supports the first IC die 10, the micro bump 112 contacts the conductive segment 138 through the first land side 109 of the molding mass 118.

Each occurrence of the micro bump 112 (in ghosted lines) and of the recess electrical bump 114 (in ghosted lines) also contact the board 120; the micro bumps 112 at the die side 121, and the recess electrical bumps 114 within a recess 117 of the board 120. The subsequent land side 107 of the IC package substrate 110, extends toward and in some embodiments, into the recess 117 (arrow touching inner wall of the board 120).

Communication between the IC substrate build-up layer 116 and the board 120 is accomplished through the micro-bumps 112 and the larger recess electrical bumps 114.

In an embodiment, the passive device 130 is one of several components on the die side 121 of the board 120. The IC substrate build-up layer footprint 132 and the molding-mass footprint 134 help to define lateral dimensions of the IC package substrate 110.

Signal communication between the first IC die 10 and the passive device 130 is by the interconnect path 136 that minimizes interconnection through the board 120. The interconnect path 136 is illustrated with the heavy dashed line 136. The interconnect path 136 passes from the IC die 10, into the IC substrate build-up layer 116, and through several vias, bond pads and traces (not illustrated) within the IC substrate build-up layer 116. The interconnect path 136 further passes through a conductive segment 138 that is on the first land side 109 and at least partially embedded within the molding mass 118 of the IC package substrate 110.

The interconnect path 136 further continues in the printed wiring board contact trace 140, such that it is a single-segment conductive body 140 for the entirety of the interconnect path 136 within the board 120. In an embodiment, the wiring board contact trace 140 includes the exposed bond finger 141 that allows the micro bump 112 to couple the conductive segment 138 in the molding mass 118 and the wiring board contact trace 140 by direct contact.

Finally, the interconnect path 136 reaches the passive device 130. By accomplishing the interconnect path 136, as described, substantial reduction of inductive looping is experienced, as the less useful interconnection through extensive path or transitions within the board 120 is avoided. Consequently, no interconnect path between the IC die 10 and the passive device 130, must pass out of the subsequent land side 107 (see FIG. 1) and into the lower echelons of the board 120, before being required to loop back upwardly (positive-Z direction) toward the passive device 130.

In an embodiment, a subsequent passive device 131, for example a capacitor is also on the die side 121, opposite the IC die 10. In an embodiment, a board component 127 such as a voltage regulator 127 is similarly coupled to the IC die 10 as is the first passive device 130. In an embodiment, a connector 125 is similarly coupled to the IC die 10 as is the first passive device. In any event, the disclosed direct interconnection is between one or more IC dice to the on-board components, without the interconnect path 136 traversing through reflective paths, such as plated through-holes and ball-grid array contact pads.

In an embodiment, the first passive device 130 is associated to a first potential and the subsequent passive device 131 is associated to a second potential that is different from the first potential. For example, the first passive device 130 is associated to a 1.0 Volt potential, and the subsequent passive device is used to decouple at a 1.5 V potential. In an embodiment, a subsequent passive device 131 operates at a third potential such as 0.5 V.

FIG. 1A is a cross-section elevation 101 of the integrated-circuit package substrate 110 depicted in elements of FIGS. 1 and 1G during assembly according to several embodiments. The IC substrate build-up layer 116 is depicted in Z-direction inverted fashion, with the die side 111 facing downwardly in preparation for assembling to a multi-level molding mass.

FIG. 1B is a cross-section elevation 102 of the integrated-circuit package substrate depicted in FIG. 1A after further assembly according to an embodiment. A precursor of the multi-level molding mass 118 is formed over the IC substrate build-up layer 116, by seating the IC substrate build-up layer 116 at the die side 111, onto a carrier 170, followed by covering the exposed surfaces of the IC substrate build-up layer 116 with the multi-level molding mass 118.

FIG. 1C is a cross-section elevation 103 of the integrated-circuit package substrate depicted in FIG. 1B after further assembly according to an embodiment. Contact corridors 172 and 174 are opened in the multi-level molding mass 118, to expose bond pads at the IC substrate build-up layer 116.

FIG. 1D is a cross-section elevation 104 of the integrated-circuit package substrate depicted in FIG. 1C after further assembly according to an embodiment. The contact corridors are filled with respective contacts 176 and 178. Further, conductive segments 138 depicted within the multi-level molding mass 118 in FIG. 1, have been plated onto the contacts 178, as well as bond pads 180 onto the contacts 176.

FIG. 1E is a cross-section elevation 105 of the integrated-circuit package substrate depicted in FIG. 1D after further assembly according to an embodiment. The conductive segments 138 and bond pads 180 are covered and exposed by patterning a solder resist layer 182 in preparation receiving micro bumps and recess electrical bumps. In an embodiment, the solder resist layer 182 includes epoxy molding compound similar to molding mass 118.

FIG. 1F is a cross-section elevation 106 of the integrated-circuit package substrate depicted in FIG. 1E after further assembly according to an embodiment. The micro bumps 112 and the recess electrical bumps 114 depicted in FIG. 1, have been filled into the patterned portion 182 of the multi-level molding mass 118.

After forming the micro bumps 112 and the recess electrical bumps 114 onto the multi-level molding mass 118, the assembly is inverted and assembled to the board 120 as illustrated in FIG. 1.

Figure 2:
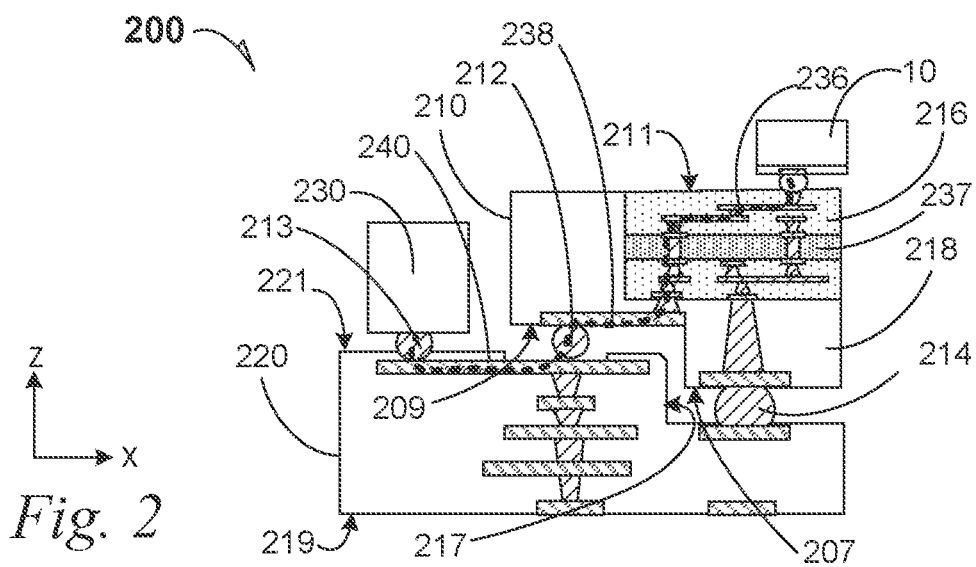
FIG. 2 is a cross-section elevation detail of an integrated-circuit package with a multi-level fan-out integrated-circuit package substrate according to several embodiments.

FIG. 2 is a cross-section elevation detail of an integrated-circuit package 200 with a multi-level fan-out integrated-circuit package substrate 210 according to several embodiments. A die side 211 supports a first integrated-circuit (IC) die 10, a first land side 209 contacts a micro bump 212, and a subsequent land side 207 contacts a recess electrical bump 214 according to several embodiments. In an embodiment, the IC package substrate 210 is a composite of an IC substrate build-up layer 216 and a molding mass 218 that at least partially encapsulates the IC substrate build-up layer 216. The die side 211 of the IC package substrate 210 shares both a portion of the IC substrate build-up layer 216 and the molding mass 218.

In an embodiment, both the first land side 209 and the subsequent land side 207 are surfaces of the molding mass 218.

Each occurrence of the micro bump 212 and of the recess electrical bump 214 also contact a board 220. The subsequent land side 207 of the IC package substrate 210, extends toward and in some embodiments, into a recess 217 of the board 220.

In an embodiment, the IC substrate build-up layer 216 has package bond pads, package vias and package traces that provide communication between the die side 211 and the first and subsequent land sides 209 and 207. Similarly, the board 220 has bond pads, vias and board traces that provide communication between the die side 221 and the land side 219.

Communication between the IC substrate build-up layer 216 and the board 220 is accomplished through the micro-bumps 212 and the larger recess electrical bumps 214. In an embodiment, the IC substrate build-up layer 216 has a core layer 237 to enhance mechanical warpage control. In an embodiment, the IC substrate build-up layer 216 is a coreless substrate build-up layer for z-height reduction or improved signal integrity for high-speed data bus applications.

In an embodiment, a passive device 230 is on the die side 221 of the board 220. In an embodiment, the device 230 is an active IC device 230.

Signal communication between the first IC die 10 and the device 230 is by an interconnect path 236 that minimizes interconnection through the board 220. The interconnect path 236 is illustrated with a heavy dashed line 236. The interconnect path 236 passes from the IC die 10, into the IC substrate build-up layer 216, and through several vias, bond pads and traces within the IC substrate build-up layer 216. The interconnect path 236 further passes through a conductive segment 238 that is on the first land side 209 and partially embedded within the molding mass 218 of the IC package substrate 210.

The interconnect path 236 further continues in a printed wiring board contact trace 240, such that it is a single-segment conductive body 240 for the entirety of the interconnect path 236 within the board 220. In an embodiment, the wiring board contact trace 240 includes an exposed bond finger (see e.g., item 141 in FIGS. 1 and 1G) that allows the micro bump 212 to couple the conductive segment 238 in the molding mass 218 and the wiring board contact trace 240 by direct contact.

Finally, the interconnect path 236 reaches the device 230. By accomplishing the interconnect path 236, as described, substantial reduction of inductive looping is experienced, as the undesired interconnection through extensive path or transitions within the board 220 is avoided. Consequently, no interconnect path between the IC die 10 and the device 230, must pass out of the subsequent land side 207 and into the lower echelons of the board 220, before being required to loop back upwardly (positive-Z direction) toward the device 230.

Figure 2A:
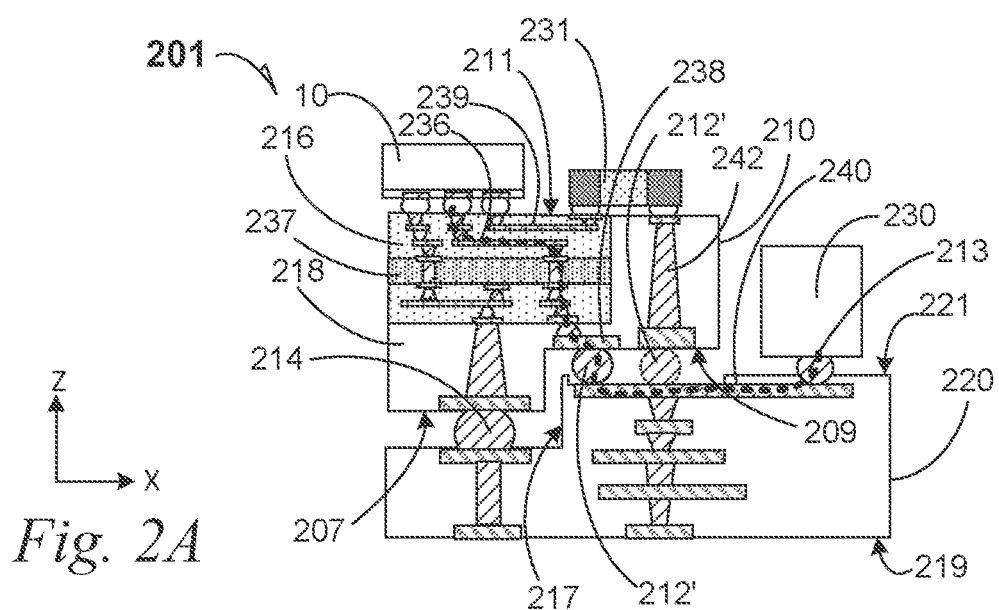
FIG. 2A is a cross-section elevation detail of an integrated-circuit package with a multi-level fan-out integrated-circuit package substrate according to several embodiments.

FIG. 2A is a cross-section elevation detail of an integrated-circuit package 201 with a multi-level fan-out integrated-circuit package substrate 210, with a die-side passive device 231 according to several embodiments. A die side 211 supports a first integrated-circuit (IC) die 10 and a die-side passive device 231 according to an embodiment. A first land side 209 contacts a micro bump 212, and a subsequent land side 207 contacts a recess electrical bump 214 according to several embodiments. In an embodiment, the IC package substrate 210 is a composite of an IC substrate build-up layer 216 and a molding mass 218 that at least partially encapsulates the IC substrate build-up layer 216. The die side 211 of the IC package substrate 210 shares both a portion of the IC substrate build-up layer 216 and the molding mass 218. In an embodiment, the passive device 231, straddles a boundary between the IC substrate build-up layer 216 and the molding mass 218 to further reduce power delivery loop inductance for enhanced power integrity.

In an embodiment, both the first land side 209 and the subsequent land side 207 are surfaces of the molding mass 218. In an embodiment, the passive device 231, for example, a decoupling capacitor 231, is directly coupled to a power supply e.g., a voltage regulator disposed on the die side 221 of the board 220 (not shown) through via 242 and micro bump 212'. The micro bump 212' is depicted in ghosted lines, as it is either in front of or behind the plane of the drawing, depending upon a useful fan-out application.

Each occurrence of the micro bump 212 and of the recess electrical bump 214 also contact a board 220. The subsequent land side 207 of the IC package substrate 210, extends toward and in some embodiments, into a recess 217 of the board 220.

In an embodiment, the IC substrate build-up layer 216 has package bond pads, package vias and package traces that provide communication between the die side 211 and the first and subsequent land sides 209 and 207. Similarly, the board 220 has bond pads, vias and board traces that provide communication between the die side 221 and the land side 219.

Communication between the IC substrate build-up layer 216 and the board 220 is accomplished through the microbumps 212 and the larger recess electrical bumps 214. In an embodiment, the IC substrate build-up layer 216 has a core layer 237 to enhance mechanical warpage control. In an embodiment, the IC substrate build-up layer 216 is a coreless substrate build-up layer for z-height reduction or improved signal integrity for high-speed data bus applications.

In an embodiment, a passive device 230 is on the die side 221 of the board 220. In an embodiment, the device 230 is an active IC device 230.

Signal communication between the first IC die 10 and the passive device 231 on the die side 211 of the package substrate 210 is by an interconnect path 239 that avoids interconnection through the board 220. Similarly, signal communication between the first IC die 10 and the passive device 230 on the die side 221 of the board 220 is by an interconnect path 236 that minimizes interconnection through the board 220. The interconnect path 236 is illustrated with a heavy dashed line 236. The interconnect path 236 passes from the IC die 10, into the IC substrate build-up layer 216, and through several vias, bond pads and traces within the IC substrate build-up layer 216. The interconnect path 236 further passes through a conductive segment 238 that is on the first land side 209 and partially embedded within the molding mass 218 of the IC package substrate 210.

The interconnect path 236 further continues in a printed wiring board contact trace 240, such that it is a single-segment conductive body 240 for the entirety of the interconnect path 236 within the board 220. In an embodiment, the wiring board contact trace 240 includes an exposed bond finger (see e.g., item 141 in FIGS. 1 and 1G) that allows the micro bump 212 to couple the conductive segment 238 in the molding mass 218 and the wiring board contact trace 240 by direct contact.

Finally, the interconnect path 236 reaches the device 230. By accomplishing the interconnect path 236, as described, substantial reduction of inductive looping is experienced, as the undesired interconnection through extensive path or transitions within the board 220 is avoided. Consequently, no interconnect path between the IC die 10 and the device 230, must pass out of the subsequent land side 207 and into the lower echelons of the board 220, before being required to loop back upwardly (positive-Z direction) toward the device 230.

Figure 3:
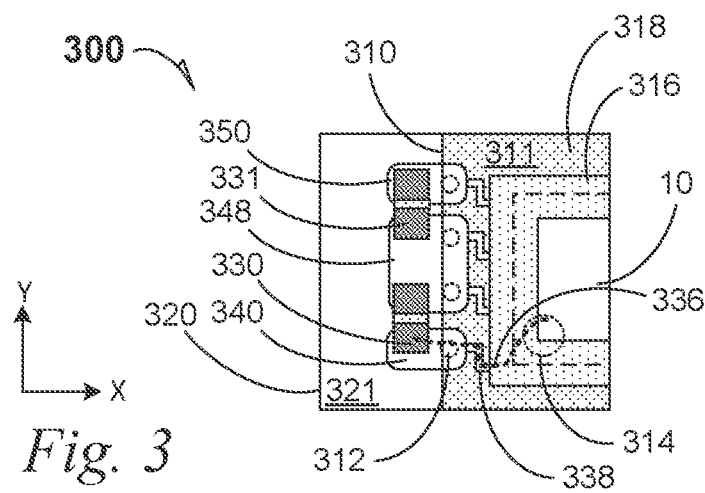
FIG. 3 is a top plan detail of an integrated-circuit package with a multi-level fan-out integrated-circuit package substrate according to several embodiments.

FIG. 3 is a top plan and schematic detail of an integrated-circuit package 300 with a multi-level fan-out integrated-circuit package substrate 310 according to several embodiments. A die side 311 supports a first integrated-circuit (IC) die 10, and a first land side (not pictured) contacts a micro bump 312, and a subsequent land side (not pictured) contacts a recess electrical bump 314 according to several embodiments. In an embodiment, the IC package substrate 310 is a composite of an IC substrate build-up layer 316 and a molding mass 318 that at least partially encapsulates the IC substrate build-up layer 316. The die side 311 of the IC package substrate 310 shares both a portion of the IC substrate build-up layer 316 and the molding mass 318.

Each occurrence of the micro bump 312 (only one enumerated) and of the recess electrical bump 314 (only one illustrated) also contact a board 320.

In an embodiment, the IC substrate build-up layer 316 has package bond pads, package vias and package traces that provide communication between the die side 311 and the first and subsequent land sides (not pictured).

Communication between the IC substrate build-up layer 316 and the board 320 is accomplished through the micro-bumps 312 and the larger recess electrical bumps 314.

In an embodiment, a passive device 330 such as a capacitor 330, is on the die side 321 of the board 320. An interconnect path 336 passes from the IC die 10 to the passive device 330, in manner as the interconnect paths 136 and 236, and a wiring-board contact trace 340 is a single-segment conductive body 340 for the entirety of the interconnect path 336 within the board 320.

The passive device 330 as a capacitor bridges between a $V_{CC}$ contact 340 to a ground contact ($V_{SS}$) 348.

In an embodiment, a subsequent passive device 331 is also coupled to the ground contact 348. In an embodiment, a subsequent wiring-board contact trace 350, operates at a different $V_{CC}$ than that of the first wiring-board contact trace 340, and the subsequent passive device 331 operates at a different capacitance. In an embodiment, the first and subsequent capacitors 330 and 331 have the same capacitance.

Figure 4:
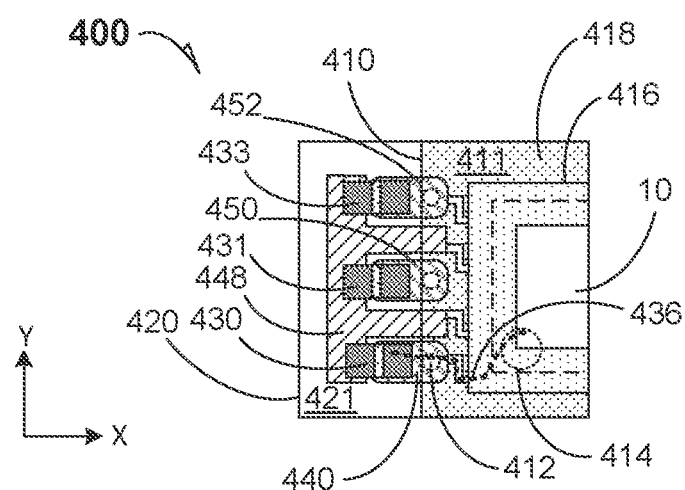
FIG. 4 is a top plan detail of an integrated-circuit package with a multi-level fan-out integrated-circuit package substrate according to several embodiments.

FIG. 4 is a top plan and schematic detail of an integrated-circuit package 400 with a multi-level fan-out integrated-circuit package substrate 410 according to several embodiments. A die side 411 supports a first integrated-circuit (IC) die 10, and a first land side (not pictured) contacts a micro bump 412, and a subsequent land side (not pictured) contacts a recess electrical bump 414 according to several embodiments. In an embodiment, the IC package substrate 410 is a composite of an IC substrate build-up layer 416 and a molding mass 418 that at least partially encapsulates the integrated-circuit substrate build-up layer 416. The die side 411 of the IC package substrate 410 shares both a portion of the IC substrate build-up layer 416 and the molding mass 418.

Each occurrence of the micro bump 412 (only one enumerated) and of the recess electrical bump 414 (only one illustrated) also contact a board 420.

In an embodiment, the integrated-circuit substrate build-up layer 416 has package bond pads, package vias and package traces that provide communication between the die side 411 and the first and subsequent land sides (not pictured).

Communication between the integrated-circuit substrate build-up layer 416 and the board 420 is accomplished through the micro-bumps 412 and the larger recess electrical bumps 414.

In an embodiment, a passive device 430 such as a capacitor 430, is on the die side 421 of the board 420. By contrast to the capacitor 330 in FIG. 3, the capacitor 430 is rotated 90 degrees such that the form factor is greater along the X-direction compared to the Y-direction. An interconnect path 436 passes from the IC die 10 to the passive device 430, in manner as the interconnect paths 136, 236 and 336, and a wiring-board contact trace 440 is a single-segment conductive body 440 for the entirety of the interconnect path 436 within the board 420. The passive device 430 as a capacitor bridges between a $V_{CC}$ contact 440 to a ground contact ($V_{SS}$) 448.

In an embodiment, a subsequent passive device 431 is also coupled to the ground contact 448. In an embodiment, a subsequent wiring-board contact trace 450, operates at a different $V_{CC}$ than that of the first wiring-board contact trace 440, and the subsequent passive device 431 operates at a different capacitance. In an embodiment, the first and subsequent capacitors 430 and 431 have the same capacitance.

In an embodiment, a third passive device 433 is also coupled to the ground contact 448. In an embodiment, a third wiring-board contact trace 452, operates at a different $V_{CC}$ than that of both the first wiring-board contact trace 440 and the subsequent wiring-board contact trace 450, and the third passive device 433 operates at a different capacitance compared to that of the first and subsequent capacitors 430 and 431. In an embodiment, the first and subsequent capacitors 430 and 431 have the same capacitance and the third capacitor operates at a different capacitance. In an embodiment, the capacitors 430, 431 and 433 operate at the same capacitance. Where the passive devices are capacitors, they may be referred to as respective capacitor first, subsequent and third passive devices 430, 431 and 433.

Figure 5:
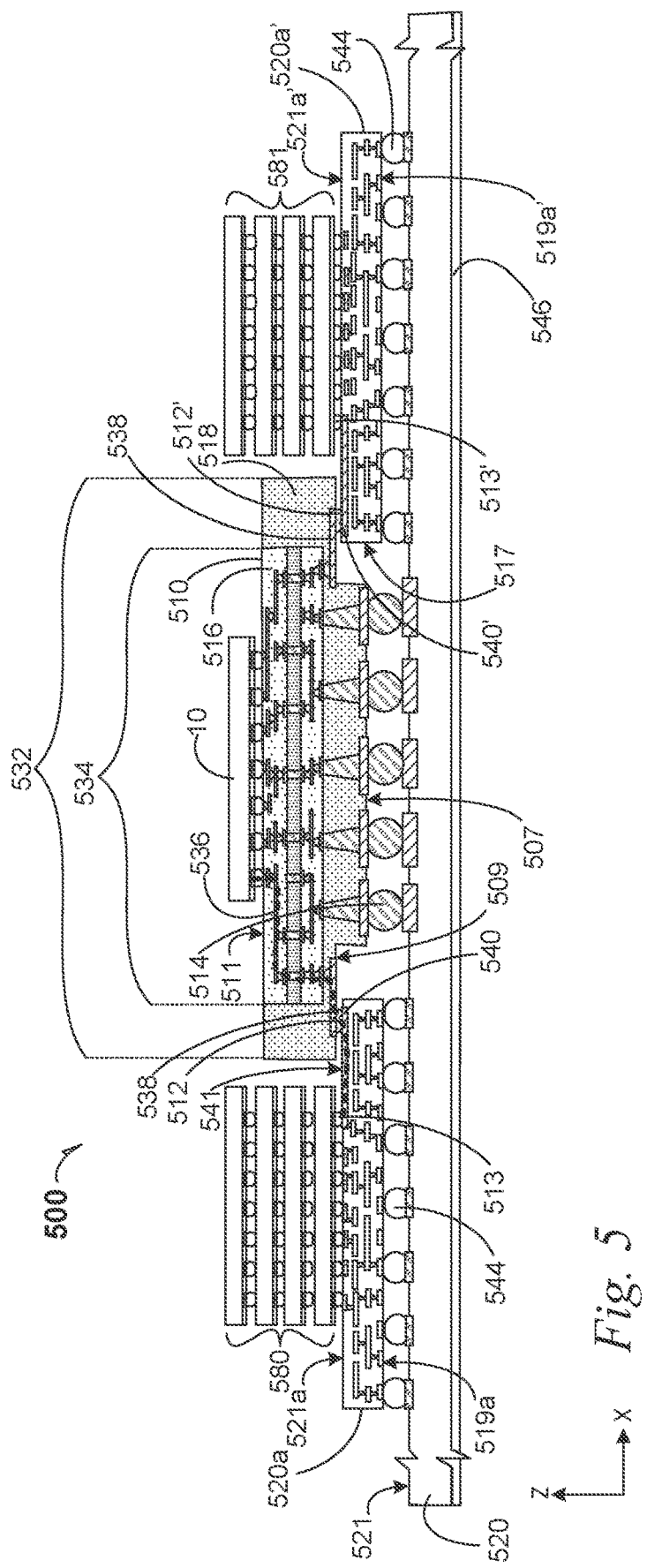
FIG. 5 is a cross-section elevation of an integrated-circuit package that includes a multi-level fan-out interconnect structure according to several embodiments.

FIG. 5 is a cross-section elevation of an integrated-circuit package 500 that includes a multi-level fan-out interconnect structure according to several embodiments. A first IC die 10 is seated, flip-chip style, on a die side 511 of an integrated-circuit package substrate 510 according to an embodiment. Opposite the die side 511 is a first land side 509 that contacts a micro bump 512, and a subsequent land side 507 that contacts a subsequent bump 514 according to several embodiments.

In an embodiment, the IC package substrate 510 is a composite of an integrated-circuit substrate build-up layer 516 and a molding mass 518 that at least partially encapsulates the integrated-circuit substrate build-up layer 516. The die side 511 of the IC package substrate 510 shares both a portion of the integrated-circuit substrate build-up layer 516 and of the molding mass 518. In an embodiment, both the first land side 509 and the subsequent land side 507 are surfaces of the molding mass 518.

In an embodiment, the subsequent bump 514 is coupled to a board 520. The subsequent land side 507 of the IC package substrate 510, extends toward and in some embodiments, into a gap 517 between a first package 520a and a subsequent package 520a'. In an embodiment, the first package 520a and the subsequent package 520a' are coupled to the IC package substrate 510 through the micro bump 512 and a subsequent micro bump 512' respectively.

In an embodiment, the integrated-circuit substrate build-up layer 516 has package bond pads, package vias and package traces that provide communication between the die side 511 and the first and subsequent land sides 509 and 507. Similarly, the first package 520a has package bond pads, package vias and package traces that provide communication between the die side 521a and the land side 519a. Communication between the integrated-circuit substrate build-up layer 516 and the die side 521a of the first package 520a is accomplished through the micro-bumps 512. Communication between the integrated-circuit substrate build-up layer 516 and the board 520 is accomplished through the larger subsequent bumps 514.

In an embodiment, a first die stack 580, such as a first memory-die stack 580, is seated on the first package 520a, and electrical communication from the first IC die 10 to the first die stack 580 is by an interconnect path 536 that minimizes interconnection through the board 520. The interconnect path 536 is illustrated with a heavy dashed line 536. The interconnect path 536 passes from the IC die 10, into the integrated-circuit substrate build-up layer 516, and through several vias, bond pads and traces within the IC package 516. The interconnect path 536 further passes through a conductive segment 538 that is on the first land side 509 and partially embedded within the molding mass 518 of the IC package substrate 510.

The signal path 536 further continues in a printed wiring board contact trace 540, such that it is a single-segment conductive body 540 for the entirety of the interconnect path 536 within the board 520. In an embodiment, the wiring board contact trace 540 includes an exposed bond finger 541 that allows the micro bump 512 to couple the conductive segment 538 in the molding mass 518 and the wiring board contact trace 540 by direct contact.

Finally, the interconnect path 536 reaches the first die stack 580. By accomplishing the interconnect path 536, as described, substantial reduction of inductive looping and/or signal losses are experienced, as the less useful interconnection through extensive path or transitions within the board 520 is avoided. Consequently, no interconnect path between the IC die 10 and the first die stack 580, must pass out of the subsequent land side 507 and into the lower echelons of the board 520, before being required to loop back upwardly (positive-Z direction) toward the first die stack 580. In an embodiment, a subsequent die stack 581 is mounted on the subsequent package 520a', and opposite the first die stack 580, across from the first IC die 10. In an embodiment, the subsequent die stack 581 is a memory die stack 581.

The first die stack 580 is coupled to the IC package 510 by a first single-segment interconnect 540 by first and second micro bumps 512 and 513, and the subsequent die stack 581 is coupled to the IC package 510 by a subsequent single-segment interconnect 540' by subsequent and second subsequent micro bumps 512' and 513', respectively.

In an embodiment, the land sides 519a, 519a' are seated on a board 520 such as a motherboard, or a printed wiring board, in a computing system, and an electrical bump array 544 contacts both the board 520 and the land sides 519a, 519a', as well as the subsequent bump 514 contacts the subsequent land side 507 of the semiconductor package substrate 510. In an embodiment, the board 520 has an external shell 546 that provides at least one of physical and electrical insulative protection for components on the board 520. For example, the external shell 546 is an integral portion of the board 520, that is part of a hand-held computing system such as a communication device. In an embodiment, the external shell 546 is an integral portion of the board 520, that is part of the exterior of a mobile computing platform such as a drone.

Figure 6:
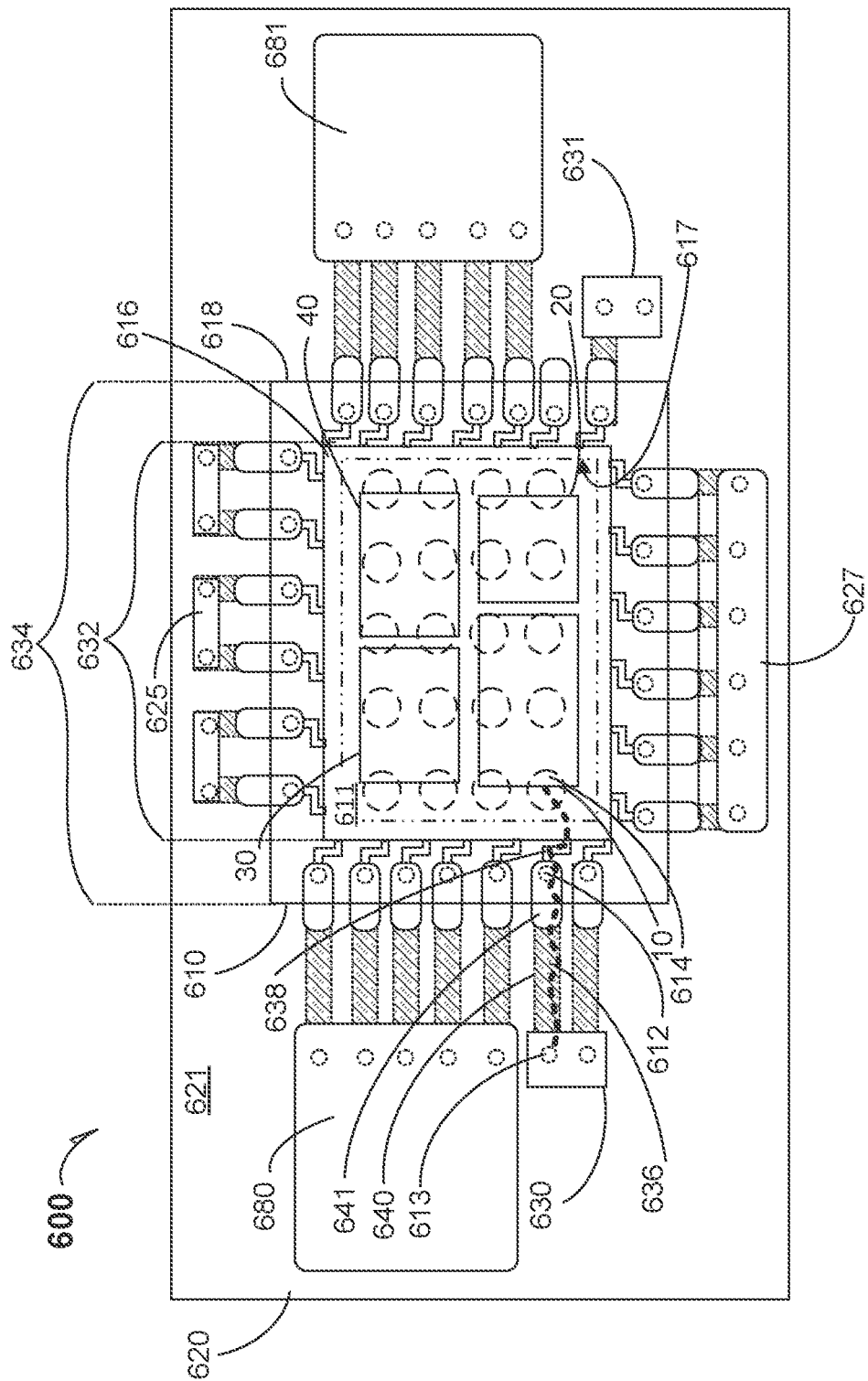
FIG. 6 is a top plan with cut-away and outline designations of an integrated-circuit package according to several embodiments.

FIG. 6 is a top plan and partial schematic with cut-away and outline designations of an integrated-circuit package 600 according to several embodiments. The top plan view represents an apparatus similar in part to the cross-section elevation 500 apparatus depicted in FIG. 5.

A die side 611 of an IC substrate build-up layer 616, supports a first IC die 10, a subsequent IC die 20, a third IC die and a fourth IC die 40 according to several embodiments. A micro bump 612 contacts a conductive segment 638 through a first land side (not illustrated, see e.g. Item 109 in FIG. 1) of a molding mass 618 of an IC package substrate 610.

In an embodiment, the first and subsequent IC dice 10 and 20 are part of a chipset for a computing system. In an embodiment, the first IC die 10 is a logic processor such as is made by Intel Corporation of Santa Clara, Calif. In an embodiment, the subsequent IC die 20 is a non-volatile memory die stack including at least one through-silicon via between IC memory dice. In an embodiment, the third IC die 30 is a platform-controller hub IC die 30. In an embodiment, the fourth IC die 40 is a baseband processor die 40.

Each occurrence of a micro bump 612 (in ghosted lines) and of a recess electrical bump 614 (in ghosted lines) also contact a board 620 at a die side 621. The subsequent land side of the IC package substrate 610, extends toward and in some embodiments, into a recess 617 (arrow touching inner wall of the board 620).

Communication between the IC substrate build-up layer 616 and the board 620 is accomplished through the microbumps 612 and the larger recess electrical bumps 614.

In an embodiment, passive devices, such as items 630 and 631 are part of several components on the die side 621 of the board 620. The IC substrate build-up layer footprint 632 and the molding-mass footprint 634 help to define lateral dimensions of the IC package substrate 610.

Communication between the first IC die 10 and the passive device 630 is by the interconnect path 636 that minimizes interconnection through the board 620. The interconnect path 636 is illustrated with the heavy dashed line 636. The interconnect path 636 passes from the IC die 10, into the IC substrate build-up layer 616, and through several vias, bond pads and traces (not illustrated) within the IC substrate build-up layer 616. The interconnect path 636 further passes through a conductive segment 638 that is on the first land side (not pictured) and partially embedded within the molding mass 618 of the IC package substrate 610.

The interconnect path 636 further continues in a printed wiring board contact trace 640, such that it is a single-segment conductive body 640 for the entirety of the interconnect path 636 within the board 620. In an embodiment, the wiring board contact trace 640 includes an exposed bond finger 641 that allows the micro bump 612 to couple the conductive segment 638 in the molding mass 618 and the wiring board contact trace 640 by direct contact.

Finally, the interconnect path 636 reaches the first passive device 630 by contact with a micro bump 613. By accomplishing the interconnect path 636, as described, substantial reduction of inductive looping is experienced, as the undesired interconnection through extensive path or transitions within the board 620 is avoided. Consequently, no interconnect path between the first IC die 10 and the first passive device 630, must pass out of the subsequent land side (not pictured) and into the lower echelons of the board 620, before being required to loop back upwardly (positive-Z direction) toward the passive device 630.

As depicted, first and subsequent die stacks 680 and 681, are similarly coupled to the IC dice 10, 20, 30 and 40 on the die side 611, as the first passive device 630.

In an embodiment, a subsequent passive device 631 is also on the die side 621, opposite the first and subsequent IC dice 10 and 20. In an embodiment, a board component 627 such as a voltage regulator 627 is similarly coupled to the several IC dice 10, 20 30 and 40 as the first passive device 630. In an embodiment, a connector 625 is similarly coupled to at least the third and fourth IC dice 30 and 40 as the first passive device 630. In any event, the disclosed direct interconnection between one or more IC dice to the on-board components, without the interconnect path 636 traversing through reflective paths, such as plated through-holes and ball-grid array contact pads.

Figure 7:
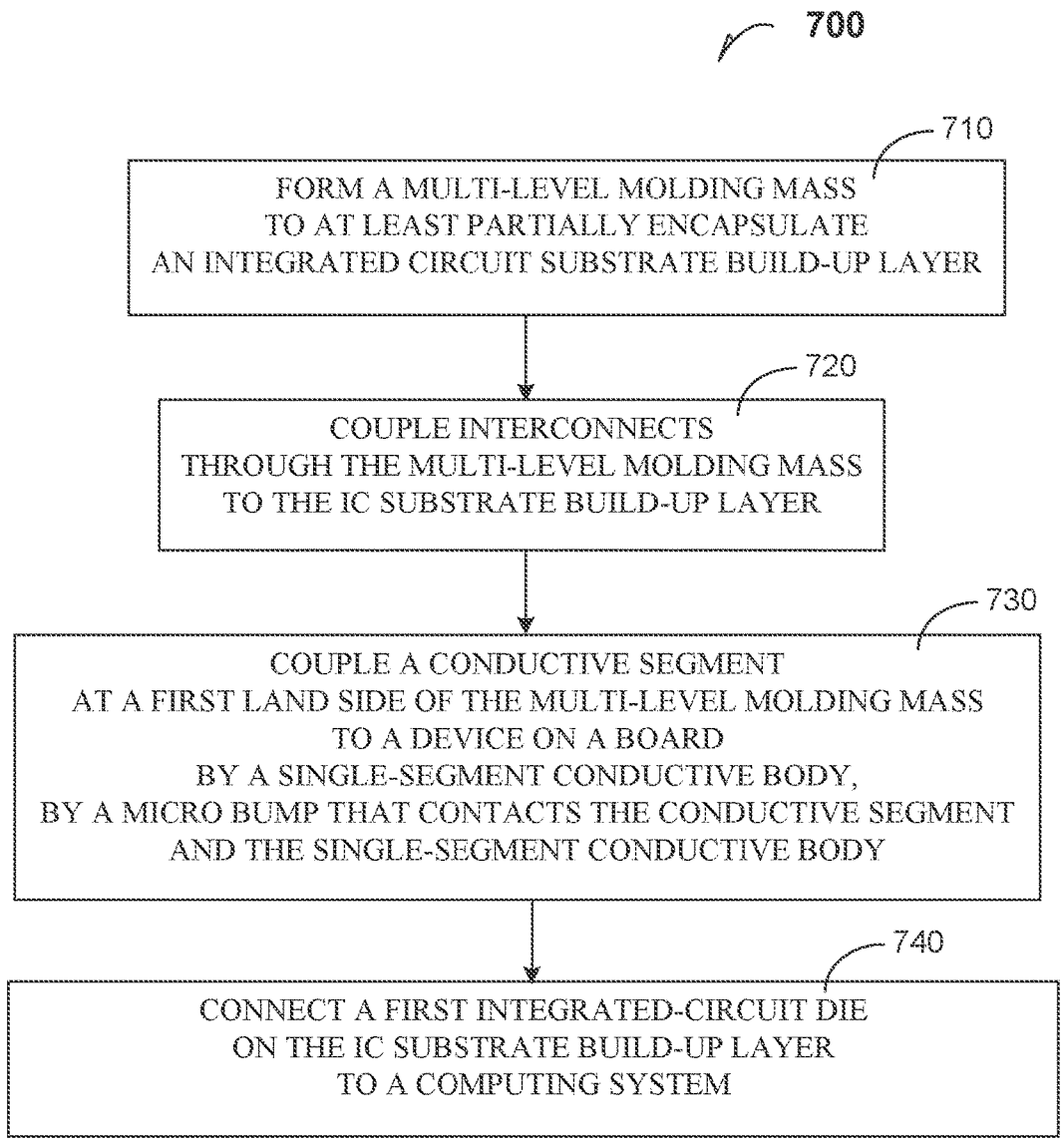
FIG. 7 is a process flow summary for assembling a multi-level fan-out integrated-circuit package according to several embodiments.

FIG. 7 is a process flow summary for assembling a multi-level fan-out integrated-circuit package according to several embodiments.

At 710, the process includes forming a multi-level molding mass to at least partially encapsulate an integrated-circuit substrate build-up layer.

At 720, the process includes coupling interconnects through land sides of the multi-level molding mass, to the integrated-circuit substrate build-up layer.

At 730, the process includes coupling a conductive segment at the first land side of the multi-level molding mass, to a device on a board by a single-segment conductive body, by a micro bump that contacts both the conductive segment and the single-segment conductive body.

At 740, the process includes connecting a first integrated-circuit die on the integrated-circuit substrate build-up layer, to a computing system.

Figure 8:
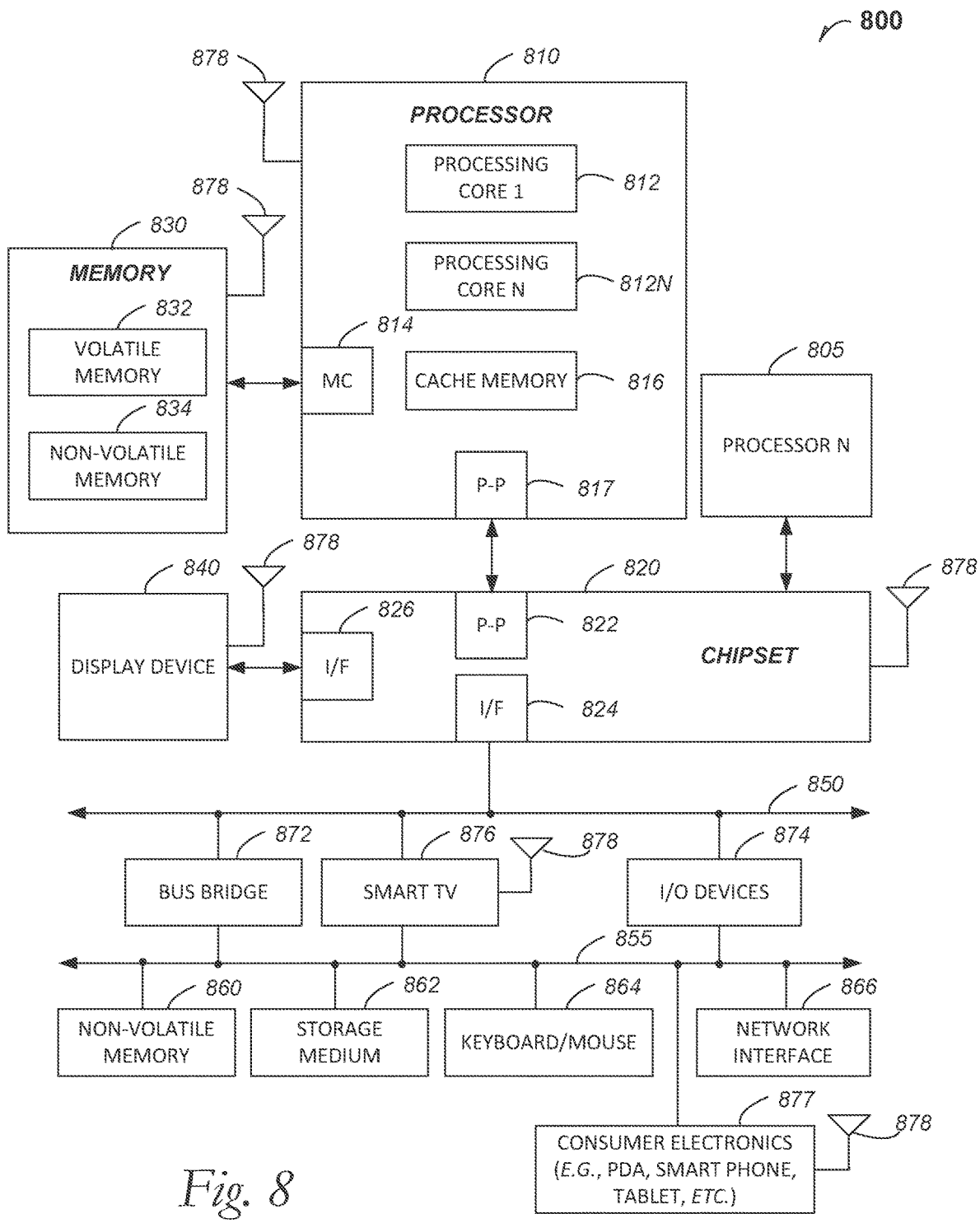
FIG. 8 is included to show an example of a higher-level device application for the disclosed embodiments.

FIG. 8 is included to show an example of a higher-level device application for the disclosed embodiments. The multi-level fan-out integrated-circuit package substrate embodiments may be found in several parts of a computing system. In an embodiment, the multi-level fan-out integrated-circuit package substrate embodiments can be part of a communications apparatus such as is affixed to a cellular communications tower. In an embodiment, a computing system 800 includes, but is not limited to, a desktop computer. In an embodiment, a computing system 800 includes, but is not limited to a laptop computer. In an embodiment, a computing system 800 includes, but is not limited to a tablet. In an embodiment, a computing system 800 includes, but is not limited to a notebook computer. In an embodiment, a computing system 800 includes, but is not limited to a personal digital assistant (PDA). In an embodiment, a computing system 800 includes, but is not limited to a server. In an embodiment, a computing system 800 includes, but is not limited to a workstation. In an embodiment, a computing system 800 includes, but is not limited to a cellular telephone. In an embodiment, a computing system 800 includes, but is not limited to a mobile computing device. In an embodiment, a computing system 800 includes, but is not limited to a smart phone. In an embodiment, a system 800 includes, but is not limited to an internet appliance. Other types of computing devices may be configured with the microelectronic device that includes multi-level fan-out integrated-circuit package substrate embodiments.

In an embodiment, the processor 810 has one or more processing cores 812 and 812N, where 812N represents the Nth processor core inside processor 810 where N is a positive integer. In an embodiment, the electronic device system 800 using a multi-level fan-out integrated-circuit package substrate embodiment that includes multiple processors including 810 and 805, where the processor 805 has logic similar or identical to the logic of the processor 810. In an embodiment, the processing core 812 includes, but is not limited to, pre-fetch logic to fetch instructions, decode logic to decode the instructions, execution logic to execute instructions and the like. In an embodiment, the processor 810 has a cache memory 816 to cache at least one of instructions and data for the multi-level fan-out integrated-circuit package substrate element on an integrated-circuit package substrate in the system 800. The cache memory 816 may be organized into a hierarchal structure including one or more levels of cache memory.

In an embodiment, the processor 810 includes a memory controller 814, which is operable to perform functions that enable the processor 810 to access and communicate with memory 830 that includes at least one of a volatile memory 832 and a non-volatile memory 834.

In an embodiment, the processor 810 is coupled with memory 830 and chipset 820. In an embodiment, the chipset 820 is part of a multi-level fan-out integrated-circuit package substrate embodiment depicted, e.g. in FIGS. 1, 1G, 2, 3, 4, 5 and 6.

The processor 810 may also be coupled to a wireless antenna 878 to communicate with any device configured to at least one of transmit and receive wireless signals. In an embodiment, the wireless antenna interface 878 operates in accordance with, but is not limited to, the IEEE 802.11 standard and its related family, Home Plug AV (HPAV), Ultra Wide Band (UWB), Bluetooth. WiMax, or any form of wireless communication protocol.

In an embodiment, the volatile memory 832 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 834 includes, but is not limited to, flash memory, phase change memory (PCM), read-only memory (ROM), electrically erasable programmable read-only memory (EEPROM), or any other type of non-volatile memory device.

The memory 830 stores information and instructions to be executed by the processor 810. In an embodiment, the memory 830 may also store temporary variables or other intermediate information while the processor 810 is executing instructions. In the illustrated embodiment, the chipset 820 connects with processor 810 via Point-to-Point (PtP or P-P) interfaces 817 and 822. Either of these PtP embodiments may be achieved using a multi-level fan-out integrated-circuit package substrate embodiment as set forth in this disclosure. The chipset 820 enables the processor 810 to connect to other elements in a multi-level fan-out integrated-circuit package substrate embodiment in a system 800. In an embodiment, interfaces 817 and 822 operate in accordance with a PtP communication protocol such as the Intel® QuickPath Interconnect (QPI) or the like. In other embodiments, a different interconnect may be used.

In an embodiment, the chipset 820 is operable to communicate with the processor 810, 805N, the display device 840, and other devices 872, 876, 874, 860, 862, 864, 866, 877, etc. The chipset 820 may also be coupled to a wireless antenna 878 to communicate with any device configured to at least do one of transmit and receive wireless signals.

The chipset 820 connects to the display device 840 via the interface 826. The display 840 may be, for example, a liquid crystal display (LCD), a plasma display, cathode ray tube (CRT) display, or any other form of visual display device. In an embodiment, the processor 810 and the chipset 820 are merged into a multi-level fan-out integrated-circuit package substrate embodiment in a system. Additionally, the chipset 820 connects to one or more buses 850 and 855 that interconnect various elements 874, 860, 862, 864, and 866. Buses 850 and 855 may be interconnected together via a bus bridge 872 such as at least one multi-level fan-out integrated-circuit package substrate embodiment. In an embodiment, the chipset 820, via interface 824, couples with a non-volatile memory 860, a mass storage device(s) 862, a keyboard/mouse 864, a network interface 866, smart TV 876, and the consumer electronics 877, etc.

In an embodiment, the mass storage device 862 includes, but is not limited to, a solid-state drive, a hard disk drive, a universal serial bus flash memory drive, or any other form of computer data storage medium. In one embodiment, the network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMAX, or any form of wireless communication protocol.

While the modules shown in FIG. 8 are depicted as separate blocks within the multi-level fan-out integrated-circuit package substrate embodiments in a computing system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into the processor core 812.

To illustrate the multi-level fan-out integrated-circuit package substrate embodiments and methods disclosed herein, a non-limiting list of examples is provided herein:

Example 1 is an integrated-circuit package apparatus, comprising: an integrated-circuit (IC) substrate build-up layer; a molding mass substrate that at least partially encapsulates the IC substrate build-up layer, wherein a portion of the IC substrate build-up layer and the molding mass substrate share a die-side surface, and wherein the molding mass substrate includes a first land side and a subsequent land side each of which have a surface parallel planar to the die-side surface, wherein the first land side is at a first level that is closer to the die-side surface that of the subsequent land side at a subsequent level; and an interconnect path restricted to vertically away from the die side, and single-direction laterally to a conductive segment on the first land side.

In Example 2, the subject matter of Example 1 optionally includes a board including a recess in the board, wherein the board is coupled to the first land side by a bump and to the subsequent land side, by a recess electrical bump in the recess, wherein the bump coupled to the first land side, is smaller than the recess electrical bump; and a passive device on a die side of the board, wherein the passive device is coupled to the integrated-circuit substrate build-up layer.

In Example 3, the subject matter of Example 2 optionally includes an integrated-circuit die on a die side of the IC substrate build-up layer, wherein the passive device is coupled to the integrated-circuit die through the interconnect signal path.

In Example 4, the subject matter of any one or more of Examples 2-3 optionally include an integrated-circuit die on a die side of the IC substrate build-up layer, wherein the passive device is coupled to the integrated-circuit die through the interconnect signal path; and a single-segment conductive body that contacts a bump that contacts the passive device on the board.

In Example 5, the subject matter of any one or more of Examples 2-4 optionally include an integrated-circuit die on a die side of the IC substrate build-up layer, wherein the passive device is coupled to the integrated-circuit die through the interconnect signal path; a single-segment conductive body that contacts a bump that contacts the passive device on the board; and an integrated-circuit device on a die side of the board, wherein the integrated-circuit device is coupled to the integrated-circuit substrate build-up layer, and wherein the integrated-circuit device contacts a bump that also contacts a single-segment conductive body that is at least partially embedded in the board.

In Example 6, the subject matter of any one or more of Examples 1-5 optionally include a board including a recess in the board, wherein the board is coupled to the first land side by a bump and to the subsequent land side, by a recess electrical bump in the recess, wherein the bump coupled to the first land side, is smaller than the recess electrical bump; and an integrated-circuit device on a die side of the board, wherein the integrated-circuit device is coupled to the integrated-circuit substrate build-up layer.

In Example 7, the subject matter of Example 6 optionally includes an integrated-circuit die on a die side of the IC substrate build-up layer, wherein the integrated-circuit device on the board is coupled to the integrated-circuit die through the interconnect signal path.

In Example 8, the subject matter of any one or more of Examples 6-7 optionally include an integrated-circuit die on a die side of the IC substrate build-up layer, wherein the integrated-circuit device on the board is coupled to the integrated-circuit die through the interconnect signal path; and a single-segment conductive body that contacts a bump that contacts the integrated-circuit device on the board.

In Example 9, the subject matter of any one or more of Examples 1-8 optionally include a board including a recess in the board, wherein the board is coupled to the first land side by a bump and to the subsequent land side, by a recess electrical bump in the recess, wherein the bump coupled to the first land side, is smaller than the recess electrical bump; a single-segment conductive body at least partially embedded in the board at a die side, wherein the single-segment conductive body contacts the bump; and a passive device coupled to the single-segment conductive body and to the bump, by a subsequent bump that contacts the passive device and the single-segment conductive body.

In Example 10, the subject matter of any one or more of Examples 1-9 optionally include a board including a recess in the board, wherein the board is coupled to the first land side by a bump and to the subsequent land side, by a recess electrical bump in the recess, wherein the bump coupled to the first land side, is smaller than the recess electrical bump; a capacitor first passive device on a die side of the board, wherein the capacitor first passive device is coupled to the integrated-circuit substrate build-up layer through a $V_{CC}$ contact and a $V_{SS}$ contact; and a capacitor subsequent passive device on the die side of the board, wherein the capacitor subsequent passive device is coupled to the integrated-circuit substrate build-up layer through the same $V_{SS}$ contact and a subsequent $V_{CC}$ contact.

In Example 11, the subject matter of any one or more of Examples 1-10 optionally include a board including a recess in the board, wherein the board is coupled to the first land side by a bump and to the subsequent land side, by a recess electrical bump in the recess; a capacitor first passive device on a die side of the board, wherein the capacitor first passive device is coupled to the integrated-circuit substrate build-up layer through a $V_{CC}$ contact and a $V_{SS}$ contact; a capacitor subsequent passive device on the die side of the board, wherein the capacitor subsequent passive device is coupled to the integrated-circuit substrate build-up layer through the same $V_{SS}$ contact and a subsequent $V_{CC}$ contact; and a capacitor third passive device on the die side of the board, wherein the capacitor third passive device is coupled to the integrated-circuit substrate build-up layer through the same $V_{SS}$ contact and the subsequent $V_{CC}$ contact.

Example 12 is an integrated-circuit package apparatus, comprising: an integrated-circuit substrate build-up layer; an integrated-circuit die on a die-side surface of the IC substrate build-up layer; and a molding mass substrate that at least partially encapsulates the IC substrate build-up layer, wherein a portion of the IC substrate build-up layer and the molding mass substrate share the die-side surface, and wherein the molding mass substrate includes a first land side and a subsequent land side each of which have a surface parallel planar to the die-side surface, wherein the first land side is at a first level that is closer to the die-side surface that of the subsequent land side at a subsequent level.

In Example 13, the subject matter of Example 12 optionally includes an interconnect signal path restricted to vertically away from the die side, and single-direction laterally to a conductive segment on the first land side.

In Example 14, the subject matter of any one or more of Examples 12-13 optionally include a board including a recess in the board, wherein the board is coupled to the first land side by a bump and to the subsequent land side, by a recess electrical bump in the recess, wherein the bump coupled to the first land side, is smaller than the recess electrical bump.

In Example 15, the subject matter of any one or more of Examples 12-14 optionally include a board including a recess in the board, wherein the board is coupled to the first land side by a bump and to the subsequent land side, by a recess electrical bump in the recess; a single-segment conductive body at least partially embedded in the board at a die side, wherein the single-segment conductive body contacts the bump; and a passive device coupled to the single-segment conductive body and to the bump, by a subsequent bump that contacts the passive device and the single-segment conductive body.

In Example 16, the subject matter of any one or more of Examples 12-15 optionally include a board including a recess in the board, wherein the board is coupled to the first land side by a bump and to the subsequent land side, by a recess electrical bump in the recess, wherein the bump coupled to the first land side, is smaller than the recess electrical bump; a single-segment conductive body at least partially embedded in the board at a die side, wherein the single-segment conductive body contacts the bump; and an integrated-circuit device coupled to the single-segment conductive body and to the bump, by a subsequent bump that contacts the integrated-circuit device and the single-segment conductive body.

In Example 17, the subject matter of any one or more of Examples 12-16 optionally include a board, wherein the board is coupled to the subsequent land side, by a subsequent bump; a first package disposed on the board at a die side, wherein the first package is coupled to the first land side by the first bump; an integrated-circuit first die stack coupled to the first package and to the first bump, by a second bump; a subsequent package disposed on the board at the die side, wherein the subsequent package is coupled to a subsequent first land side by a subsequent first bump; and an integrated-circuit subsequent die stack coupled to the subsequent package and to the subsequent first bump, by a subsequent second bump.

Example 18 is a process of assembling an integrated-circuit package substrate, comprising: forming a multi-level molding mass to at least partially encapsulate an integrated-circuit substrate build-up layer; coupling interconnects through land sides of the multi-level molding mass, to the integrated-circuit substrate build-up layer; and coupling a conductive segment at the first land side of the multi-level molding mass, to a device on a board by a single-segment conductive body, by a bump that contacts both the conductive segment and the single-segment conductive body.

In Example 19, the subject matter of Example 18 optionally includes assembling at least one of a passive device and an integrated-circuit device on a die side of the board, wherein each of the at least one of the passive and integrated-circuit device is coupled to a single-segment conductive body that is at least partially embedded in the die side of the board; and connecting a first integrated-circuit die on a die-side surface of the integrated-circuit substrate build-up layer.

In Example 20, the subject matter of any one or more of Examples 18-19 optionally include assembling at least one of a passive device and an integrated-circuit device on a die side of the board, wherein each of the at least one of the passive and integrated-circuit device is coupled to a single-segment conductive body that is at least partially embedded in the die side of the board-side package; connecting a first integrated-circuit die on a die-side surface of the integrated-circuit substrate build-up layer; and connecting the first integrated-circuit die to a computing system.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit package apparatus, comprising:
   an integrated-circuit (IC) substrate build-up layer;
   a molding mass substrate that at least partially encapsulates the IC substrate build-up layer, wherein a portion of the IC substrate build-up layer and the molding mass substrate share a die-side surface, and wherein the molding mass substrate includes a first land side and a subsequent land side each of which have a surface parallel planar to the die-side surface, wherein the first land side and the subsequent land side each include an electrical connection, wherein the first land side is at a first level that is closer to the die-side surface that of the subsequent land side at a subsequent level; and
   an interconnect path restricted to vertically away from the die side surface, and single-direction laterally to a conductive segment on the first land side.

2. The integrated-circuit package apparatus of claim 1, further including:
   a board including a recess in the board, wherein the board is coupled to the first land side by a bump and to the subsequent land side, by a recess electrical bump in the recess, wherein the bump coupled to the first land side, is smaller than the recess electrical bump; and
   a passive device on a die side of the board, wherein the passive device is coupled to the integrated-circuit substrate build-up layer.

3. The integrated-circuit package apparatus of claim 2, further including an integrated-circuit die on a die side of the IC substrate build-up layer, wherein the passive device is coupled to the integrated-circuit die through the interconnect signal path.

4. The integrated-circuit package apparatus of claim 2, further including:
   an integrated-circuit die on a die side of the IC substrate build-up layer, wherein the passive device is coupled to the integrated-circuit die through the interconnect signal path; and
   a single-segment conductive body that contacts a bump that contacts the passive device on the board.

5. The integrated-circuit package apparatus of claim 2, further including:
   an integrated-circuit die on a die side of the IC substrate build-up layer, wherein the passive device is coupled to the integrated-circuit die through the interconnect signal path;
   a single-segment conductive body that contacts a bump that contacts the passive device on the board; and an integrated-circuit device on a die side of the board, wherein the integrated-circuit device is coupled to the integrated-circuit substrate build-up layer, and wherein the integrated-circuit device contacts a bump that also contacts a single-segment conductive body that is at least partially embedded in the board.

6. The integrated-circuit package apparatus of claim 1, further including:
a board including a recess in the board, wherein the board is coupled to the first land side by a bump and to the subsequent land side, by a recess electrical bump in the recess, wherein the bump coupled to the first land side, is smaller than the recess electrical bump; and
an integrated-circuit device on a die side of the board, wherein the integrated-circuit device is coupled to the integrated-circuit substrate build-up layer.

7. The integrated-circuit package apparatus of claim 6, further including an integrated-circuit die on a die side of the IC substrate build-up layer, wherein the integrated-circuit device on the board is coupled to the integrated-circuit die through the interconnect signal path.

8. The integrated-circuit package apparatus of claim 6, further including:
an integrated-circuit die on a die side of the IC substrate build-up layer, wherein the integrated-circuit device on the board is coupled to the integrated-circuit die through the interconnect signal path; and
a single-segment conductive body that contacts a bump that contacts the integrated-circuit device on the board.

9. The integrated-circuit package apparatus of claim 1, further including:
a board including a recess in the board, wherein the board is coupled to the first land side by a bump and to the subsequent land side, by a recess electrical bump in the recess, wherein the bump coupled to the first land side, is smaller than the recess electrical bump;
a single-segment conductive body at least partially embedded in the board at a die side, wherein the single-segment conductive body contacts the bump; and
a passive device coupled to the single-segment conductive body and to the bump, by a subsequent bump that contacts the passive device and the single-segment conductive body.

10. The integrated-circuit package apparatus of claim 1, further including:
a board including a recess in the board, wherein the board is coupled to the first land side by a bump and to the subsequent land side, by a recess electrical bump in the recess, wherein the bump coupled to the first land side, is smaller than the recess electrical bump;
a capacitor first passive device on a die side of the board, wherein the capacitor first passive device is coupled to the integrated-circuit substrate build-up layer through a $V_{CC}$ contact and a $V_{SS}$ contact; and
a capacitor subsequent passive device on the die side of the board, wherein the capacitor subsequent passive device is coupled to the integrated-circuit substrate build-up layer through the same $V_{SS}$ contact and a subsequent $V_{CC}$ contact.

11. The integrated-circuit package apparatus of claim 1, further including:
a board including a recess in the board, wherein the board is coupled to the first land side by a bump and to the subsequent land side, by a recess electrical bump in the recess;
a capacitor first passive device on a die side of the board, wherein the capacitor first passive device is coupled to the integrated-circuit substrate build-up layer through a $V_{CC}$ contact and a $V_{SS}$ contact;
a capacitor subsequent passive device on the die side of the board, wherein the capacitor subsequent passive device is coupled to the integrated-circuit substrate build-up layer through the same $V_{SS}$ contact and a subsequent $V_{CC}$ contact; and
a capacitor third passive device on the die side of the board, wherein the capacitor third passive device is coupled to the integrated-circuit substrate build-up layer through the same $V_{SS}$ contact and the subsequent $V_{CC}$ contact.

12. An integrated-circuit package apparatus, comprising:
an integrated-circuit substrate build-up layer;
an integrated-circuit die on a die-side surface of the IC substrate build-up layer; and
a molding mass substrate that at least partially encapsulates the IC substrate build-up layer, wherein a portion of the IC substrate build-up layer and the molding mass substrate share the die-side surface, and wherein the molding mass substrate includes a first land side and a subsequent land side each of which have a surface parallel planar to the die-side surface, wherein the first land side and the subsequent land side each include an electrical connection, wherein the first land side is at a first level that is closer to the die-side surface that of the subsequent land side at a subsequent level.

13. The integrated-circuit package apparatus of claim 12, further including:
an interconnect signal path restricted to vertically away from the die side surface, and single-direction laterally to a conductive segment on the first land side.

14. The integrated-circuit package apparatus of claim 12, further including:
a board including a recess in the board, wherein the board is coupled to the first land side by a bump and to the subsequent land side, by a recess electrical bump in the recess, wherein the bump coupled to the first land side, is smaller than the recess electrical bump.

15. The integrated-circuit package apparatus of claim 12, further including:
a board including a recess in the board, wherein the board is coupled to the first land side by a bump and to the subsequent land side, by a recess electrical bump in the recess;
a single-segment conductive body at least partially embedded in the board at a die side, wherein the single-segment conductive body contacts the bump; and
a passive device coupled to the single-segment conductive body and to the bump, by a subsequent bump that contacts the passive device and the single-segment conductive body.

16. The integrated-circuit package apparatus of claim 12, further including:
a board including a recess in the board, wherein the board is coupled to the first land side by a bump and to the subsequent land side, by a recess electrical bump in the recess, wherein the bump coupled to the first land side, is smaller than the recess electrical bump;
a single-segment conductive body at least partially embedded in the board at a die side, wherein the single-segment conductive body contacts the bump; and an integrated-circuit device coupled to the single-segment conductive body and to the bump, by a subsequent bump that contacts the integrated-circuit device and the single-segment conductive body.

17. The integrated-circuit package apparatus of claim 12 further including:
   a board, wherein the board is coupled to the subsequent land side, by a subsequent bump;
   a first package disposed on the board at a die side, wherein the first package is coupled to the first land side by the first bump;
   an integrated-circuit first die stack coupled to the first package and to the first bump, by a second bump;
   a subsequent package disposed on the board at the die side, wherein the subsequent package is coupled to a subsequent first land side by a subsequent first bump; and
   an integrated-circuit subsequent die stack coupled to the subsequent package and to the subsequent first bump, by a subsequent second bump.

18. A process of assembling an integrated-circuit package substrate, comprising:
   forming a multi-level molding mass to at least partially encapsulate an integrated-circuit substrate build-up layer;
   coupling interconnects through land sides of the multi-level molding mass, to the integrated-circuit substrate build-up layer; and
   coupling a conductive segment at a first land side of the land sides of the multi-level molding mass, to a device on a board by a single-segment conductive body, by a bump that contacts both the conductive segment and the single-segment conductive body.

19. The process of claim 18, further including:
   assembling at least one of a passive device and an integrated-circuit device on a die side of the board, wherein each of the at least one of the passive and integrated-circuit device is coupled to a single-segment conductive body that is at least partially embedded in the die side of the board; and
   connecting a first integrated-circuit die on a die-side surface of the integrated-circuit substrate build-up layer.

20. The process of claim 18, further including:
   assembling at least one of a passive device and an integrated-circuit device on a die side of the board, wherein each of the at least one of the passive and integrated-circuit device is coupled to a single-segment conductive body that is at least partially embedded in the die side of the board-side package;
   connecting a first integrated-circuit die on a die-side surface of the integrated-circuit substrate build-up layer; and
   connecting the first integrated-circuit die to a computing system.

* * * * *